United States Patent
Nagpal et al.

(10) Patent No.: US 10,349,377 B1
(45) Date of Patent: Jul. 9, 2019

(54) METHOD AND SYSTEM FOR EMBEDDED DEVICE LOCALIZATION-BASED PROGRESSIVE INDICATORS

(71) Applicant: MAPSTED CORP., Mississauga (CA)

(72) Inventors: Paramvir Singh Nagpal, Brampton (CA); Saeedeh Hamidifar, Mississauga (CA)

(73) Assignee: MAPSTED CORP., Mississauga, Ontario (CA)

( * ) Notice: Subject to any disclaimer, the term of this patent is extended or adjusted under 35 U.S.C. 154(b) by 0 days.

(21) Appl. No.: 16/123,043

(22) Filed: Sep. 6, 2018

(51) Int. Cl.
| | |
|---|---|
| *H04W 4/02* | (2018.01) |
| *H04W 64/00* | (2009.01) |
| *G01C 5/06* | (2006.01) |
| *G01R 33/02* | (2006.01) |
| *G01S 11/12* | (2006.01) |

(52) U.S. Cl.
CPC ............ *H04W 64/003* (2013.01); *G01C 5/06* (2013.01); *G01R 33/02* (2013.01); *G01S 11/12* (2013.01)

(58) Field of Classification Search
CPC .............................. H04W 4/02; H04W 64/003
See application file for complete search history.

(56) References Cited

U.S. PATENT DOCUMENTS

| | | | |
|---|---|---|---|
| 2008/0186234 A1* | 8/2008 | Alles .................. | G01S 5/021 342/451 |
| 2009/0043504 A1 | 2/2009 | Bandyopadhyay et al. | |
| 2010/0225447 A1* | 9/2010 | Adra .................. | G01S 5/0294 340/10.1 |
| 2011/0161855 A1* | 6/2011 | Prehofer ........... | H04M 1/72572 715/771 |
| 2013/0082825 A1* | 4/2013 | Dworschak ........ | H04W 4/02 340/8.1 |
| 2014/0300452 A1* | 10/2014 | Rofe .................. | G06K 7/10158 340/10.1 |
| 2016/0138913 A1* | 5/2016 | Estevo, Jr. ........ | G01B 21/16 702/150 |
| 2016/0253691 A1* | 9/2016 | Dante, III .......... | G06Q 30/0207 705/14.1 |
| 2016/0379074 A1 | 12/2016 | Nielsen et al. | |

* cited by examiner

*Primary Examiner* — Christopher M Brandt
(74) *Attorney, Agent, or Firm* — Henry L Ohab

(57) ABSTRACT

A method and system of locating an embedded computing and communication device. The method, executed in a processor of a server computing device, comprises receiving, from a locator device, a request for locating the embedded device hosted within a host asset device, localizing the embedded device, determining a proximity of the locator device relative to the embedded device, and operating at least one user interface indicator based on the proximity.

20 Claims, 3 Drawing Sheets

METHOD AND SYSTEM FOR EMBEDDED DEVICE LOCALIZATION-BASED PROGRESSIVE INDICATORS

TECHNICAL FIELD

The disclosure herein relates to the field of localization of embedded computing and communication devices.

BACKGROUND

A manufacturer may commonly deploy assets within a factory floor, or similar indoor facility, for use in manufacturing processes. Such assets, including tooling molds, may be movable in location, and being very expensive assets, need to be accurately tracked for rapid deployment, or re-deployment and use. Frequently, however, such assets may have been moved, for myriad unrecorded reasons, from their expected or nominal positions since last used.

DETAILED DESCRIPTION

Figure 1:
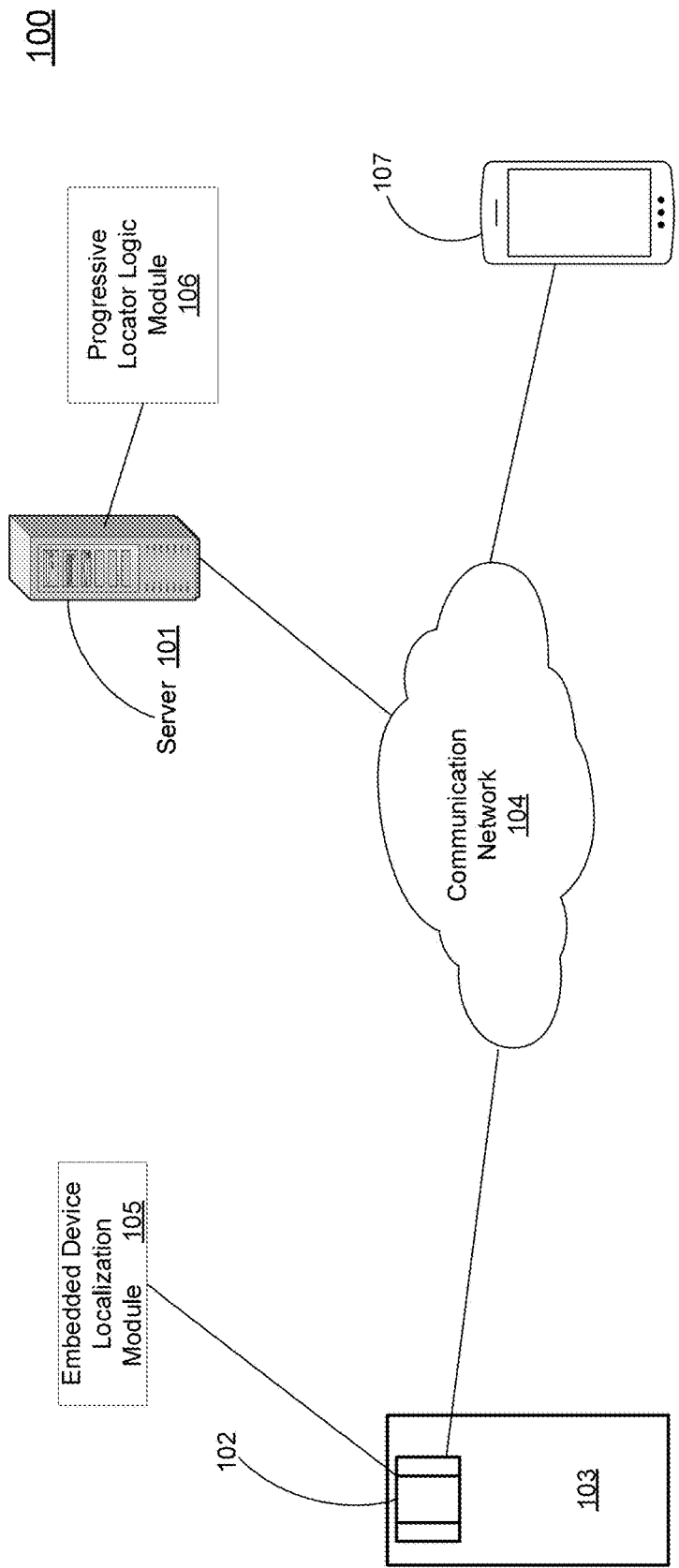
FIG. 1 illustrates, in an example embodiment, a localization-based system for progressively locating an embedded communication device.

Movable assets on a manufacturing facility floor may be difficult to locate in a timely manner. Among other benefits, the disclosure herein allows locating of a given asset device within a crowded facility that hosts many confusingly similar assets in an intuitive, convenient and rapid manner, and minimizes the potential for theft, misplacement and unauthorized movements of the asset.

Provided is a method of locating an embedded computing and communication device, executed at least partly in a processor of a server computing device, that comprises receiving, from a locator device, a request for locating the embedded device hosted within a host asset device, localizing the embedded device, determining a proximity of the locator device relative to the embedded device, and operating at least one user interface indicator based on the proximity.

Also provided is a server computing device for locating an embedded computing and communication device. The server computing device comprises a processor and a memory including instructions executable in the processor to receive, from a locator device, a request for locating the embedded device hosted within a host asset device, localize the embedded device, determine a proximity of the locator device relative to the embedded device, and operate at least one user interface indicator based on the proximity.

The terms localize, or localization, as used herein refer to determining a unique coordinate position of the mobile device at a specific location along a pedestrian route being traversed relative to the indoor area or building. In some embodiments, localization may also include determining a floor within the building, and thus involve determining not only horizontal planar (x, y) coordinates, but also include a vertical, or z, coordinate of the mobile device, the latter embodying a floor number within a multi-floor building, for example. In other embodiments, the (x, y, z) coordinates may be expressed either in a local reference frame specific to the mobile device, or in accordance with a global coordinate reference frame.

The pedestrian area, in embodiments, may be an indoor area within any one of a manufacturing facility, a shopping mall, a warehouse, an airport facility, a hospital facility, a university campus facility or any at least partially enclosed building. The term pedestrian as used herein is intended not encompass not only walking pedestrians, but also users of mobile phones moving at typical pedestrian speeds, for example at less than 10 miles per hour using automated means within the pedestrian area, including but not limited to automated wheelchairs or automated people-moving indoor carts.

One or more embodiments described herein provide that methods, techniques, and actions performed by a computing device are performed programmatically, or as a computer-implemented method. Programmatically, as used herein, means through the use of code or computer-executable instructions. These instructions can be stored in one or more memory resources of the computing device. A programmatically performed step may or may not be automatic.

One or more embodiments described herein can be implemented using programmatic modules, engines, or components. A programmatic module, engine, or component can include a program, a sub-routine, a portion of a program, or a software component or a hardware component capable of performing one or more stated tasks or functions. As used herein, a module or component can exist on a hardware component independently of other modules or components. Alternatively, a module or component can be a shared element or process of other modules, programs or machines.

Furthermore, one or more embodiments described herein may be implemented through the use of logic instructions that are executable by one or more processors. These instructions may be carried on a computer-readable medium. In particular, machines shown with embodiments herein include processor(s) and various forms of memory for storing data and instructions. Examples of computer-readable mediums and computer storage mediums include portable memory storage units, and flash memory (such as carried on smartphones). An embedded device as described herein utilizes processors, memory, and logic instructions stored on computer-readable medium. Embodiments described herein may be implemented in the form of computer processor-executable logic instructions or programs stored on computer memory mediums.

System Description

FIG. 1 illustrates, in an example embodiment, localization-based system 100 for progressively locating embedded communication and computing device 102, also referred to herein as embedded device 102. Embedded device 102 may include a processor, memory and associated circuitry to accomplish any one or more of telephony, data communication, and data computing. Embedded device 102 may be fixedly or removably hosted within host asset device 103, which in one embodiment may be a manufacturing tooling mold deployed in a manufacturing facility. Embedded device 102 may include fingerprint data of a surrounding or proximate pedestrian area, such as a factory manufactory floor or multiple floors, stored in local memory. In other variations, embedded device 102 may be connected within a computer network communication system, including the internet or other wide area network, to remote server computing device 101 storing the fingerprint data of the pedestrian area, the latter being communicatively accessible to embedded device 102 for download of the fingerprint data. Locator device 107 may be a portable device that incorporates communication and computing capability, including a display user interface, and is communicatively coupled to server device 101 and embedded device 102.

A pedestrian navigation, or indoor positioning, software application may be downloaded and installed, or stored, in a memory of embedded device 102 and further include a physical layout map of a manufacturing facility or building. In one embodiment, the pedestrian navigation software application may incorporate one or more portions of processor-executable instructions manifesting embedded device localization module 105. The terms localize or localization as used herein refer to determining an estimated coordinate position (x, y, z) along a pedestrian route or trajectory being traversed in accompaniment of embedded device 102. A display of the physical layout map at locator device 107 may further show a trajectory or pedestrian route traversed by a user in possession of locator device 107 relative to host asset device 103 and embedded device 102 within the pedestrian area.

Embedded device 102 may include sensor functionality by way of sensor devices. The sensor devices may include inertial sensors such as an accelerometer and a gyroscope, and magnetometer or other magnetic field sensing functionality, barometric or other ambient pressure sensing functionality, humidity sensor, thermometer, and ambient lighting sensors such as to detect ambient lighting intensity. Embedded device 102 may also include capability for detecting and communicatively accessing ambient wireless communication signals including but not limited to any of Bluetooth and Bluetooth Low Energy (BLE), Wi-Fi, RFID, and also satellite-based navigations signals including global positioning system (GPS) signals. Embedded device 102 further includes the capability for detecting, via sensor devices, and measuring a received signal strength, and of determining signal connectivity parameters, related to the ambient wireless signals. In particular, embedded device 102 may include location determination capability such as by way of a GPS module having a GPS receiver, and a communication interface for communicatively coupling to communication network 104, including by sending and receiving cellular data over data and voice channels.

A fingerprint data repository, or any portion(s) thereof, may be stored in server computing device 101 (also referred to herein as server 101) and made communicatively accessible to embedded device 102 via communication network 104. Server 101 may include progressive locator logic module 106 comprised of instructions executable in a processor of server device 101. In some embodiments, it is contemplated that the fingerprint data repository, or any portions of data and processor-executable instructions constituting the fingerprint data repository, may be downloaded for storage, at least temporarily, within a memory of embedded device 102. In embodiments, the fingerprint map data stored in the fingerprint data repository further associates particular positions along pedestrian route of the manufacturing facility or indoor area with a particular combination of time-stamped fingerprint data, including gyroscope data, accelerometer data, wireless signal strength data, wireless connectivity data, magnetic data, barometric data, acoustic data, line-of sight data, and ambient lighting data stored thereon.

The terms fingerprint and fingerprint data as used herein refer to time-correlated, time-stamped individual measurements of any of, or any combination of, received wireless communication signal strength and signal connectivity parameters, magnetic field parameters (strength, direction) or barometric pressure parameters, and mobile device inertial sensor data at known, particular locations along a route being traversed, and also anticipated for traversal, by the mobile device. In other words, a fingerprint as referred to herein may include a correlation of sensor and signal information (including, but not necessarily limited to wireless signal strength, wireless connectivity information, magnetic or barometric information, inertial sensor information and GPS location information) associated for a unique location relative to the facility in accordance with a particular time stamp of gathering the set of mobile sensor data by time correlating the mobile device gyroscope data, the mobile device accelerometer data, mobile device magnetometer data and any other applicable mobile device sensor data, for example. Thus, fingerprint data associated with a particular location or position may provide a fingerprint signature that uniquely correlates to that particular location or position. A sequence of positions or locations that constitute a navigation path traversed by the mobile device relative to a given indoor facility may be fingerprint-mapped during a calibration process, and the resulting fingerprint map stored in a fingerprint data repository of server 101. Server 101 may store respective fingerprint maps of various buildings and indoor areas. The respective building or indoor facility fingerprint maps, or any portions thereof, may be downloaded into a memory of embedded device 102 for use in conjunction with the pedestrian navigation software application executing thereon.

A particular fingerprint or signature based on any of received wireless communication signal strength and signal connectivity parameters, magnetic field parameters or barometric pressure parameters, and mobile device inertial sensor data may be detected or recorded by embedded device 102, whereupon the fingerprint or signature as detected may be matched to a reference fingerprint, or a reference pattern including a set of fingerprints, in a stored fingerprint map of a given facility made accessible to embedded device localization module 105 to identify a unique position of embedded device 102 along a pedestrian route. As used herein, term signal connectivity, as distinguished from a signal strength, refers to a wireless radio frequency (RF) signal being available for use in bi-directional data communication, such as between devices that both transmit and receive data using that available wireless RF signal. In some embodiments, given that sampling times and sampling rates applied in conjunction with particular mobile device sensors may be different, the signal and sensor information as measured during the fingerprint calibration process may be time-averaged across particular periods of time, with the time-averaged value being used to represent the signal information at any given instance of time within that particular period of time in which the signal information is time-averaged. Fingerprint data may be used to track traversal of embedded device 102 along a sequence of positions that constitute a pedestrian route within, and even adjoining, the indoor facility.

Embedded device localization module 105, constituted of logic instructions executable in a processor of embedded device 102 in one embodiment, may be hosted at embedded device 102 and provides, at least in part, capability for localizing embedded device 102 along a pedestrian route traversed in an indoor area such as a given floor of a multi-floor manufacturing facility, in one embodiment. In alternate embodiments, one or more portions constituting embedded device localization module 105 may be hosted remotely at a server device and made communicatively accessible to embedded device 102 via communication network 104.

Host asset device 103, which in an embodiment may be a manufacturing mold tooling or similar asset, may include user interface features or indicators, for instance, including but not limited to visible display(s) and audible alert capability. The user interface features may be controlled by a processor of embedded device 102, or alternately a local processor within host asset device 103 that is communicatively coupled to the processor of embedded device 102. The visible display may include liquid crystal display devices and light emitting diode devices of one or more colors. The audible alerts may be generated in varying audible volume and at varying intermittencies.

Figure 2:
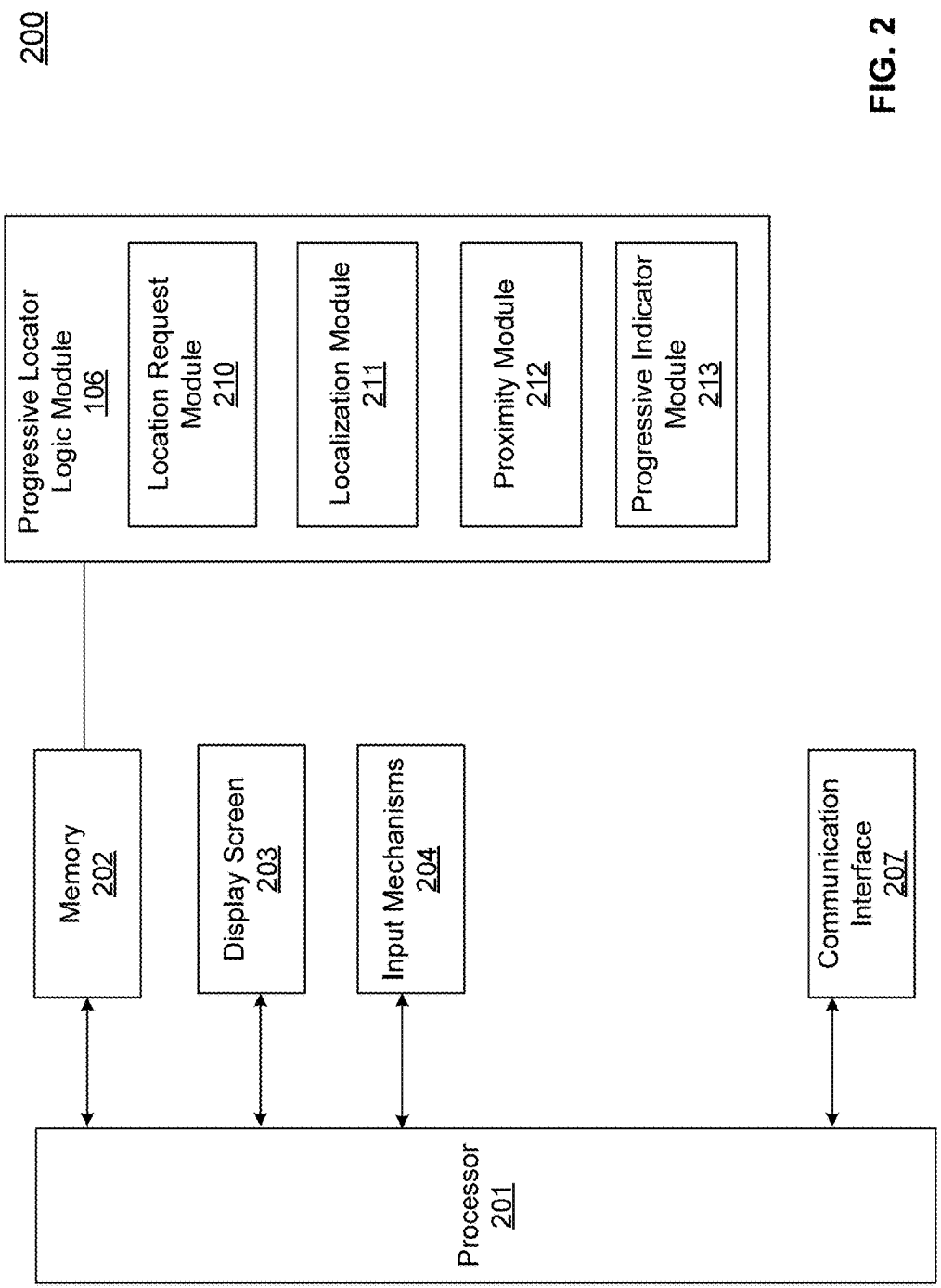
FIG. 2 illustrates, in one example embodiment, an architecture of a server computer in a localization-based system for progressively locating an embedded communication device.

FIG. 2 illustrates, in one example embodiment, architecture 200 of a server computer in a localization-based system for progressively locating an embedded communication device. Server 101, in embodiment architecture 200, may be implemented on one or more server devices, and includes processor 201, memory 202 which may include a read-only memory (ROM) as well as a random access memory (RAM) or other dynamic storage device, display device 203, input mechanisms 204 and communication interface 207 communicatively coupled to communication network 104. Processor 201 is configured with software and/or other logic to perform one or more processes, steps and other functions described with implementations, such as described by FIGS. 1 through 3 herein. Processor 201 may process information and instructions stored in memory 202, such as provided by a random access memory (RAM) or other dynamic storage device, for storing information and instructions which are executable in processor 201. Memory 202 also may be used for storing temporary variables or other intermediate information during execution of instructions to be executed by processor 201. Memory 202 may also include the ROM or other static storage device for storing static information and instructions for processor 201; a storage device, such as a magnetic disk or optical disk, may be provided for storing information and instructions. Communication interface 207 enables server 101 to communicate with one or more communication networks 104 (e.g., a cellular network) through use of the both wired and wireless network links. Using the network link, server 101 can communicate with embedded device 102.

Embedded device localization module 105 of embedded device 102 includes instructions stored in memory 202 of embedded device 102, the instructions being executable in a processor of embedded device 102. In alternate embodiments, it is contemplated that any one or more or portions of embedded device localization module 105 may be located at remote server device 101 communicatively accessible to mobile devices 102a-n via network communication interface 207.

Progressive locator logic module 106 of server 101 may include executable instructions comprising sub-modules location request module 210, localization module 211, proximity module 212 and progressive indicator module 213.

Processor 201 uses executable instructions of location request module 210 to receive, from locator device 107, a request for localization of embedded device 102 placed within host asset device 103.

Processor 201, in conjunction with embedded device localization module 105 in an embodiment, uses executable instructions stored in localization module 211 to localize embedded device 102.

Processor 201 uses executable instructions stored in proximity module 212 to determine a proximity of locator device 107 relative to embedded device 102.

Processor 201 uses executable instructions stored in progressive indicator module 213 to operate at least one user interface indicator, in one embodiment a user interface indicator within host access device 103, in response to determining the proximity.

Methodology

Figure 3:
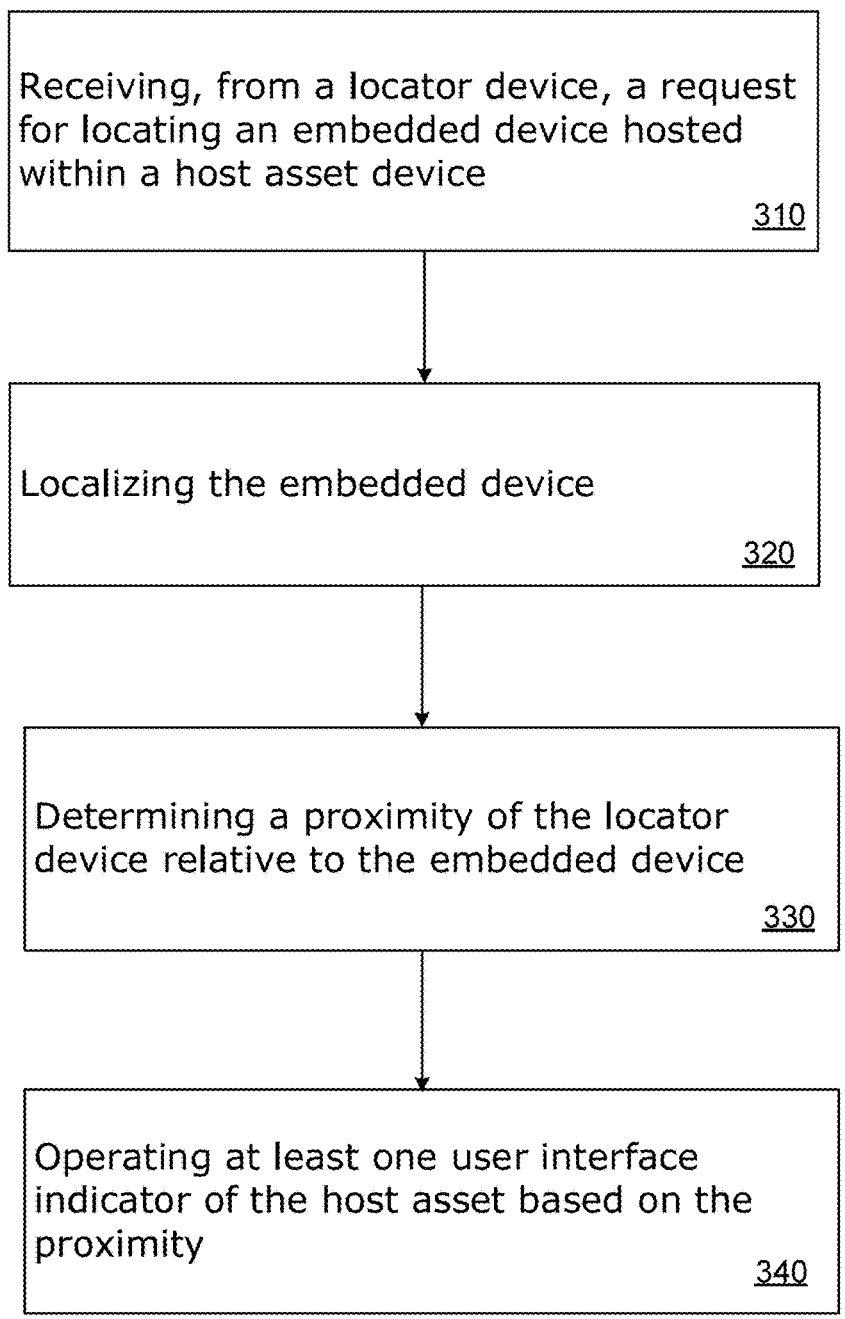
FIG. 3 illustrates an example embodiment localization-based method of progressively locating an embedded communication device.

FIG. 3 illustrates an example embodiment 300 localization-based method of progressively locating embedded device 102 in place within host asset device 103. In describing examples of FIG. 3, reference is made to the examples of FIGS. 1-2 for purposes of illustrating suitable components or elements for performing a step or sub-step being described.

Examples of method steps described herein relate to the use of embedded device 102 for implementing the techniques described. According to one embodiment, the techniques are performed by embedded device localization module 105 of embedded device 102 in response to execution of one or more sequences of software logic instructions that constitute embedded device localization module 105. In embodiments, progressive locator logic module 106 may include the one or more sequences of instructions within any one or more, or parts, of sub-modules including location request module 210, and localization module 211, proximity module 212 and progressive indicator module 213. Such instructions may be read into memory 202 of server 101 from machine-readable medium, such as memory storage devices, or downloaded into memory 202 via network communication interface 207. In executing the sequences of instructions of location request module 210, localization module 211, proximity module 212 and progressive indicator module 213 in memory 202, processor 201 performs the process steps described herein. In alternative implementations, at least some hard-wired circuitry may be used in place of, or in combination with, the software logic instructions to implement examples described herein. Thus, the examples described herein are not limited to any particular combination of hardware circuitry and software instructions. Additionally, it is contemplated that in alternative embodiments, the techniques herein, or portions thereof, may be distributed between embedded device 102 and remote but communicatively accessible server computing device 101.

At step 310, processor 201 executes instructions included in location request module 210 to receive, from locator device 107, a request for locating embedded device 102 hosted within host asset device 103.

At step 320, processor 201 executes instructions included in localization module 211 to generate, using the processor, a request for localizing embedded device 102. The localizing may comprise location coordinate information and floor number information for embedded device 102 within a multi-floor manufacturing facility or building. The localizing may be based on at least one of a magnetic field strength and direction, a received wireless communication signal strength, a wireless connectivity indication and a barometric pressure in accordance with fingerprint data of the multi-floor building. The fingerprint data may include respective time-stamps whereby the magnetic field strength and direction, the received wireless signal strength, the wireless connectivity indication and the barometric pressure are the localizing comprises location coordinate information and floor number information for the embedded device within a multi-floor building.

In one embodiment, a probabilistic confidence level may be associated with localizing embedded device 102. In an embodiment, the localizing comprises a coordinate location having a probabilistic estimate expressed as a confidence level. A confidence level indicative of a degree of accuracy for the localized position of embedded device 102 may be determined, given that the accuracy associated with estimating the position, or location, of a embedded device 102 as a consequence of localization is not absolute, but rather is subject to the statistical, or probabilistic, nature of the fingerprint parameters, including but not limited to the inherently probabilistic nature of wireless radio frequency signal parameters as received. In some embodiments, a degree of accuracy associated with the position estimation may be indicated by a confidence level that is determined for, and assigned in conjunction with, estimated first and second positions as localized. As a measure of the accuracy of localization of embedded device 102, the confidence level associated with the location estimate may be obtained by fusing the probabilistic results of multiple concurrent location estimates. In some embodiments, the variance in the x and y components, with respect to their mean values ($\mu_x, \mu_y$), can be estimated independently as:

$$\sigma_x^2 = \frac{1}{N-1} \sum (x - \mu_x)^2$$
$$\sigma_y^2 = \frac{1}{N-1} \sum (y - \mu_y)^2$$

and combined to produce the confidence level. In one embodiment, the overall confidence level can be selected as a function of the maximum standard deviation of the x-y components, as $\sigma = \max(\sigma_x, \sigma_y)$. In other embodiments, a weighted variance of the x and y, where the weights are based on the probability of each individual estimate can be used to produce the confidence estimate. When multiple trajectory-based location estimates are available, trajectories can be grouped into categories based on similarity and a probability spread/confidence can be assigned on a per-group basis. If the per-group probability/confidence level of one group significantly exceeds that of the other groups, then the confidence in the validity of that group is raised, and hence, the confidence in the location estimate increases. Conversely, if several distinct per-group probabilities are similar, then the confidence in the per-group results are reduced, leading to a lower confidence level. Thus, the estimated position, or position as localized, comprises a probabilistic estimate expressed as a confidence level.

At step 330, processor 201 of server 101 executes instructions included in proximity module 212 to determine a proximity of locator device 107 relative to embedded device 102. In one embodiment, a display of the physical layout map of the manufacturing facility, or a given floor of same, at locator device 107 may further show a trajectory or pedestrian route traversed by a user in possession of locator device 107 relative to host asset device 103 and embedded device 102 within the pedestrian area.

In one embodiment, determining the proximity includes determining at least one of a distance and a compass direction of embedded device 102 relative to locator device 107.

At step 340, processor 201 of server 101 executes instructions included in progressive indicator module 213 to operate one or more user interface indicators, in one embodiment a user interface indicator within host access device 103, in response to determining the proximity.

In another embodiment, the user interface indicator may be one or more of an audible and a visible indicator at the host asset device. The visible indicators may be a set of LED lights operated to pulse at higher and higher rates, or changing in colors, as locator device 107 progresses closer to host asset 103, thereby to draw attention to the particular tooling mold device that might have been the subject of the request from locator device 107. The audible indicator may an audible alert, operated at varyingly higher audible pitch levels, in an embodiment, as locator device 107 approaches closer to host asset device 103.

In another variation, the audible and visible indicators may only be operated once embedded device 102 is localized with some threshold level of confidence, for instance, only if the confidence level of the localization for embedded device 102 and host asset device 103 exceeds 70 percent.

It is contemplated for embodiments described herein to extend to individual elements and concepts described herein, independently of other concepts, ideas or system, as well as for embodiments to include combinations of elements recited anywhere in this application. Although embodiments are described in detail herein with reference to the accompanying drawings, it is to be understood that the invention is not limited to those precise embodiments. As such, many modifications and variations will be apparent to practitioners skilled in this art. Accordingly, it is intended that the scope of the invention be defined by the following claims and their equivalents. Furthermore, it is contemplated that a particular feature described either individually or as part of an embodiment can be combined with other individually described features, or parts of other embodiments, even if the other features and embodiments make no specific mention of the particular combination of features. Thus, the absence of describing combinations should not preclude the inventors from claiming rights to such combinations.

What is claimed is:

1. A method, executed in a processor of a server computing device, of locating an embedded device, the method comprising:
   receiving at the server computing device, from a locator device, a request for locating the embedded device hosted within a host asset device, the server computing device being communicatively coupled to the embedded device and the locator device;
   localizing the embedded device, based on fingerprint data of a pedestrian area and data received from the embedded device, the embedded device comprising the fingerprint data, wherein localization comprises a confidence level determined by fusing probabilistic results of multiple concurrent location estimates of the embedded device;
   providing, to the locator device, localization results for showing a trajectory traversed by a user in possession of the locator device relative to the host asset device and the embedded device within the pedestrian area;
   determining a proximity of the locator device relative to the embedded device; and
   providing an input to operate at least one user interface indicator based on the proximity and the confidence level.

2. The method of claim 1 wherein the embedded device is one of removably and fixedly hosted within the host asset device.

3. The method of claim 1 wherein determining the proximity includes determining at least one of a distance and a direction of the embedded device relative to the locator device.

4. The method of claim 3 wherein the at least one indicator comprises at least one of an audible and a visible indicator at the host asset device.

5. The method of claim 4 further comprising varyingly operating the at least one indicator as the locator device advances in proximity to the embedded device.

6. The method of claim 1 wherein the localizing comprises location coordinate information and floor number information for the embedded device within a multi-floor building.

7. The method of claim 1 wherein the localizing is based on at least one of a magnetic field strength and direction, a received wireless communication signal strength, a wireless connectivity indication and a barometric pressure in accordance with the fingerprint data of a multi-floor building.

8. The method of claim 7 wherein the fingerprint data includes time-stamps whereby the magnetic field strength and direction, the received wireless signal strength, the wireless connectivity indication and the barometric pressure are time-correlated based on the time-stamps.

9. The method of claim 1 wherein the localizing comprises a coordinate location associated with a probabilistic estimate expressed as the confidence level.

10. The method of claim 9 further comprising operating the at least one user interface indicator only if the confidence level exceeds 70 percent.

11. A server computing system for locating an embedded device, the server computing system comprising:
a processor; and
a memory including instructions executable in the processor to:
receive, from a locator device, a request for locating the embedded device hosted within a host asset device, the server computing device being communicatively coupled to the embedded device and a locator device;
localize the embedded device, based on fingerprint data of a pedestrian area and data received from the embedded device, the embedded device comprising the fingerprint data, wherein localization comprises a confidence level determined by fusing probabilistic results of multiple concurrent location estimates of the embedded device;
provide, to the locator device, localization results for showing a trajectory traversed by a user in possession of the locator device relative to the host asset device and the embedded device within the pedestrian area;
determine a proximity of the locator device relative to the embedded device; and
provide an input to operate at least one user interface indicator based on the proximity and the confidence level.

12. The server computing system of claim 11 wherein the embedded device is one of removably and fixedly hosted within the host asset device.

13. The server computing system of claim 12 wherein determining the proximity includes determining at least one of a distance and a direction of the embedded device relative to the locator device.

14. The server computing system of claim 13 wherein the at least one indicator comprises at least one of an audible and a visible indicator at the host asset device.

15. The server computing system of claim 14 further comprising instructions executable in the processor to varyingly operate the at least one indicator as the locator device advances in proximity to the embedded device.

16. The server computing system of claim 11 wherein the localizing comprises location coordinate information and floor number information for the embedded device within a multi-floor building.

17. The server computing system of claim 11 wherein the localizing is based on at least one of a magnetic field strength and direction, a received wireless communication signal strength, a wireless connectivity indication and a barometric pressure in accordance with the fingerprint data of a multi-floor building.

18. The server computing system of claim 17 wherein the fingerprint data includes respective time-stamps whereby the magnetic field strength and direction, the received wireless signal strength, the wireless connectivity indication and the barometric pressure are time-correlated in accordance with the respective time-stamps.

19. The server computing system of claim 11 wherein the localizing comprises a coordinate location associated with a probabilistic estimate expressed as the confidence level.

20. The server computing system of claim 19 further comprising instructions executable in the processor to operate the at least one user interface indicator only if the confidence level exceeds 70 percent.

* * * * *